US006882021B2

(12) United States Patent
Boon et al.

(10) Patent No.: US 6,882,021 B2
(45) Date of Patent: Apr. 19, 2005

(54) PACKAGED IMAGE SENSING MICROELECTRONIC DEVICES INCLUDING A LEAD AND METHODS OF PACKAGING IMAGE SENSING MICROELECTRONIC DEVICES INCLUDING A LEAD

(75) Inventors: Suan Jeung Boon, Singapore (SG); Yong Poo Chia, Singapore (SG); Min Yu Chan, Singapore (SG); Meow Koon Eng, Singapore (SG); Siu Waf Low, Singapore (SG); Swee Kwang Chua, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/651,914

(22) Filed: Aug. 29, 2003

(65) Prior Publication Data
US 2004/0238909 A1 Dec. 2, 2004

(30) Foreign Application Priority Data
May 30, 2003 (SG) .......................................... 200303053

(51) Int. Cl.[7] .......................................... H01L 31/0203
(52) U.S. Cl. ...................... 257/434; 257/431; 257/433; 438/48; 438/64
(58) Field of Search ................................ 257/228, 434, 257/678, 680, 431, 432, 433, 435, 436, 438, 439, 440; 438/48, 54, 65, 64, 69

(56) References Cited

U.S. PATENT DOCUMENTS

| 5,130,783 | A | * | 7/1992 | McLellan |
| 5,145,099 | A | | 9/1992 | Wood et al. |
| 5,677,566 | A | | 10/1997 | King et al. |
| 5,708,293 | A | * | 1/1998 | Ochi et al. |
| 5,826,628 | A | | 10/1998 | Hamilton |
| 5,879,965 | A | | 3/1999 | Jiang et al. |
| 5,986,209 | A | | 11/1999 | Tandy |
| RE36,469 | E | | 12/1999 | Wood et al. |
| 6,048,744 | A | | 4/2000 | Corisis et al. |
| 6,103,547 | A | | 8/2000 | Corisis et al. |
| 6,104,086 | A | * | 8/2000 | Ichikawa et al. |
| 6,130,474 | A | | 10/2000 | Corisis |
| 6,133,068 | A | | 10/2000 | Kinsman |
| 6,133,622 | A | | 10/2000 | Corisis et al. |
| 6,148,509 | A | | 11/2000 | Schoenfeld et al. |
| 6,150,710 | A | | 11/2000 | Corisis |
| 6,153,924 | A | | 11/2000 | Kinsman |
| 6,159,764 | A | | 12/2000 | Kinsman et al. |
| 6,225,689 | B1 | | 5/2001 | Moden et al. |
| 6,228,548 | B1 | | 5/2001 | King et al. |
| 6,229,202 | B1 | | 5/2001 | Corisis |
| 6,239,489 | B1 | | 5/2001 | Jiang |
| 6,246,108 | B1 | | 6/2001 | Corisis et al. |
| 6,246,110 | B1 | | 6/2001 | Kinsman et al. |
| 6,258,623 | B1 | | 7/2001 | Moden et al. |
| 6,258,624 | B1 | | 7/2001 | Corisis |
| 6,261,865 | B1 | | 7/2001 | Akram |
| 6,271,580 | B1 | | 8/2001 | Corisis |
| 6,284,571 | B1 | | 9/2001 | Corisis et al. |

(Continued)

FOREIGN PATENT DOCUMENTS

JP  07-263607  * 10/1995

Primary Examiner—Nathan J. Flynn
Assistant Examiner—Kevin Quinto
(74) Attorney, Agent, or Firm—Perkins Coie LLP

(57) ABSTRACT

Packaged microelectronic devices and methods of packaging microelectronic devices are disclosed herein. In one embodiment, the device includes an image sensor die having a first side with a bond-pad, an active area on the first side, and a second side opposite the first side. The device further includes a window at the first side of the image sensor die and a lead mounted to the second side of the image sensor die. The window is radiation transmissive and positioned over the active area of the image sensor die. The lead is electrically coupled to the bond-pad on the image sensor die.

38 Claims, 4 Drawing Sheets

U.S. PATENT DOCUMENTS

| | | |
|---|---|---|
| 6,291,894 B1 | 9/2001 | Farnworth et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,329,705 B1 | 12/2001 | Ahmad |
| 6,331,448 B1 | 12/2001 | Ahmad |
| 6,344,976 B1 | 2/2002 | Schoenfeld et al. |
| 6,372,548 B1 * | 4/2002 | Bessho et al. |
| 6,407,381 B1 | 6/2002 | Glenn et al. |
| 6,503,780 B1 | 1/2003 | Glenn et al. |
| 6,548,757 B1 | 4/2003 | Russell et al. |
| 2002/0089025 A1 * | 7/2002 | Chou |
| 2002/0096729 A1 * | 7/2002 | Tu et al. |
| 2003/0062601 A1 * | 4/2003 | Harnden et al. |

* cited by examiner

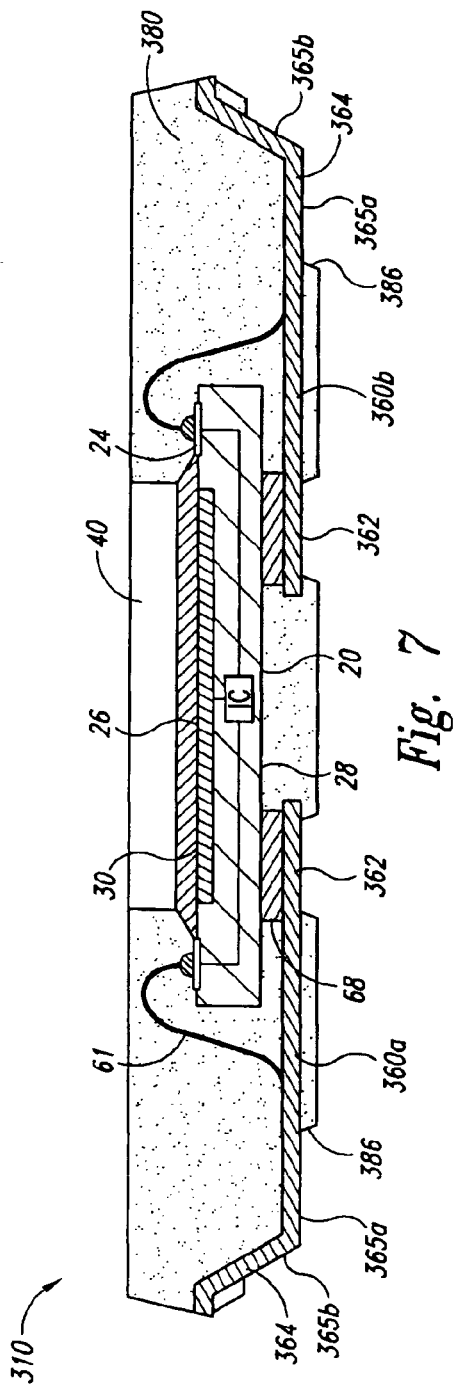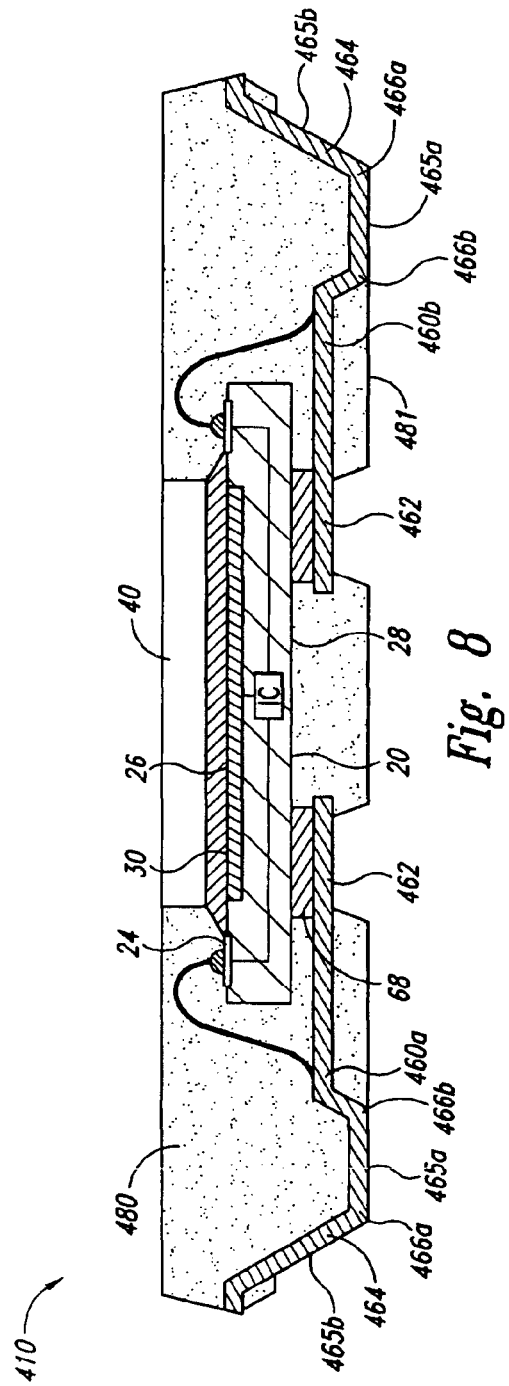

PACKAGED IMAGE SENSING MICROELECTRONIC DEVICES INCLUDING A LEAD AND METHODS OF PACKAGING IMAGE SENSING MICROELECTRONIC DEVICES INCLUDING A LEAD

CROSS-REFERENCE TO RELATED APPLICATION

This application claims priority benefits of Singapore Application No. 200303053-3 filed May 30, 2003, the entirety of which is incorporated herein by reference.

TECHNICAL FIELD

The present invention is related to packaged microelectronic devices and methods of packaging microelectronic devices. In particular, the present invention relates to packaged microelectronic devices that include image sensor dies.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by back-grinding and cutting the wafer. After the wafer has been singulated, the individual dies are typically "packaged" to couple the bond-pads to a larger array of electrical terminals that can be more easily coupled to the various power supply lines, signal lines, and ground lines.

An individual die can be packaged by electrically coupling the bond-pads on the die to arrays of pins, ball-pads, or other types of electrical terminals, and then encapsulating the die to protect it from environmental factors (e.g., moisture, particulates, static electricity, and physical impact). For example, in one application, the bond-pads can be electrically connected to contacts on an interposer substrate that has an array of ball-pads. The die and a portion of the interposer substrate are then encapsulated with a covering.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the height of the packaged microelectronic device and the surface area or "footprint" of the microelectronic device on a printed circuit board. Reducing the size of the microelectronic device is difficult because high performance microelectronic devices generally have more bond-pads, which result in larger ball-grid arrays and thus larger footprints.

Image sensor dies present additional packaging problems. Image sensor dies include an active area that is responsive to electromagnetic radiation. In packaging, it is important to cover and protect the active area without obstructing or distorting the passage of light or other electromagnetic radiation. Typically, an image sensor die is packaged by placing the die in a recess of a ceramic substrate and attaching a glass window to the substrate over the active area to hermetically seal the package. A vacuum is typically drawn to remove air from the gap between the image sensor die and the glass window. An inert gas can then be injected into the gap between the image sensor die and the glass window. One drawback of packaging image sensor dies in accordance with this method is the difficulty of removing dust, moisture, and other contaminants from the gap between the glass window and the image sensor die. Furthermore, the packaged image sensor dies are relatively bulky and, accordingly, use more space on a circuit board or other external device than other types of dies.

One existing approach to address the foregoing drawbacks is to attach a window directly to an image sensor die with a window support, such as an epoxy. In this approach a top portion of the window is machined to create a step to receive mold compound. The image sensor die is also attached to a die attach pad, and the bond-pads on the image sensor die are electrically coupled to leads that are positioned proximate to the ends of the image sensor die. The image sensor die, the die attach pad, and the step in the window are encapsulated. This approach, however, has several drawbacks. For example, the package does not effectively transfer heat away from the image sensor die because the leads are positioned proximate to the edge of the package. Moreover, the package has a high profile because the leads project outwardly away from the package. Furthermore, the mold compound does not effectively adhere to the die attach pad, and accordingly, separation can occur. In addition, machining the step in the window adds another procedure and expense to the manufacturing process.

BRIEF DESCRIPTION OF THE DRAWINGS

FIG. 1 is a schematic cross-sectional side view of the microelectronic device after a window has been attached to an image sensor die.

FIG. 2 is a schematic cross-sectional side view of the microelectronic device after attaching a plurality of leads to the image sensor die.

FIG. 3 is a schematic cross-sectional side view of a mold apparatus for encapsulating the microelectronic device.

FIG. 4 is a schematic cross-sectional side view of the microelectronic device after forming a plurality of solder balls.

FIG. 7 is a schematic cross-sectional side view of a microelectronic device in accordance with yet another embodiment of the invention.

FIG. 8 is a schematic cross-sectional side view of a microelectronic device in accordance with still another embodiment of the invention.

DETAILED DESCRIPTION

A. Overview

Figure 1:
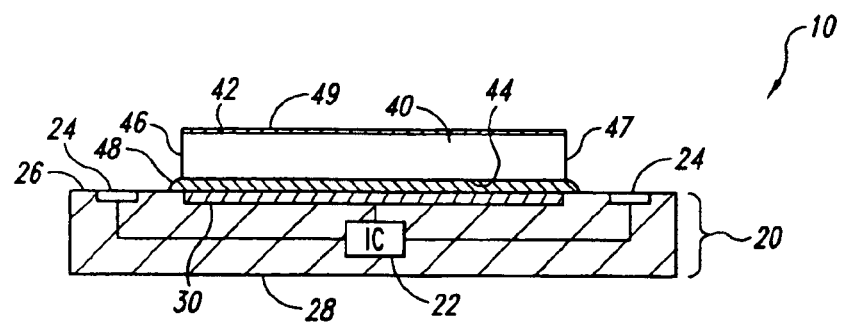
FIGS. 1–4 illustrate various stages in a method of packaging a microelectronic device in accordance with one embodiment of the invention.

The following description is directed toward packaged microelectronic devices and methods of packaging microelectronic devices. Many specific details of several embodiments are described below with reference to packaged microelectronic devices having image sensor dies to provide a thorough understanding of such embodiments. The present invention, however, can be practiced using other types of microelectronic devices and/or micromechanical devices. Those of ordinary skill in the art will best understand that the invention may have additional embodiments, or that the invention may be practiced without several of the details described below.

One aspect of the invention is directed to packaged microelectronic devices. In one embodiment, a packaged microelectronic device includes an image sensor die having a first side with a bond-pad, an active area on the first side, and a second side opposite the first side. The device further includes a window at the first side of the image sensor die and a lead mounted to the second side of the image sensor die. The window is radiation transmissive and positioned over the active area of the image sensor die. The lead is electrically coupled to the bond-pad on the image sensor die. The device can also include a removable protective covering attached to the side of the window opposite the image sensor die. The window can be attached to the image sensor die with an adhesive, and the lead can be attached to the image sensor die with lead-on-chip tape.

In one aspect of this embodiment, the device further includes a casing over the bond-pad, a portion of the second side of the image sensor die, and a portion of the lead. The casing can include a recess exposing a portion of the lead to the ambient environment. The lead can include an end external to the casing that has an arcuate or other suitable configuration. Alternatively, the ends of the lead can be covered by the casing and a portion of the lead between the ends can be exposed to the ambient environment. The device can further include a ball-pad coupled to the lead and a solder ball on the ball-pad.

Another aspect of the invention is directed to methods of packaging microelectronic devices. The packaged microelectronic devices include image sensor dies having a first side with a bond-pad, an active area on the first side, and a second side opposite the first side. In one embodiment, the method includes attaching a radiation transmissive window to the first side of the image sensor die, mounting a lead to the second side of the image sensor die, electrically coupling the bond-pad to the lead, and encapsulating a portion of the lead and a portion of the second side of the image sensor die with a casing. In one aspect of this embodiment, encapsulating the lead and the image sensor die includes disposing the window, the image sensor, and the lead in a mold cavity and injecting a mold compound in the mold cavity. The method can further include attaching a removable protective covering over a portion of the window, forming a ball-pad on the lead, and placing a solder ball on the ball-pad.

B. A Method of Packaging a Microelectronic Device

FIGS. 1–4 illustrate various stages in a method of packaging a microelectronic device in accordance with one embodiment of the invention. For example, FIG. 1 is a schematic cross-sectional side view of a microelectronic device 10 including an image sensor die 20 and a window 40 attached to the image sensor die 20. The image sensor die 20 includes a first side 26 having a plurality of bond-pads 24 and an active area 30 responsive to electromagnetic radiation. For example, in one embodiment, the active area 30 includes a sensitive area with a plurality of sensor cells. The image sensor die 20 further includes a second side 28 opposite the first side 26 and an integrated circuit 22 (shown schematically) electrically coupled to the active area 30 and the bond-pads 24.

In one aspect of this embodiment, an adhesive 48 is deposited over the active area 30 on the first side 26 of the image sensor die 20. The adhesive 48 is a transmissive material to permit light and/or other electromagnetic radiation to pass through the adhesive 48 and contact the active area 30. For example, the adhesive 48 can be an optical grade material with a high transparency and a uniform mass density to allow maximum light transmission. The adhesive 48 can also be a highly pure material to minimize contamination and thereby reduce or eliminate the loss of images and/or light scattering. Suitable adhesives 48 include BCB manufactured by Dow Chemical of Midland, Mich., or other similar materials.

After the adhesive 48 is deposited, the window 40 is placed on the adhesive 48 and attached to the image sensor die 20 over the active area 30. The window 40 includes a first side 42, a second side 44 opposite the first side 42, a first end 46, and a second end 47 opposite the first end 46. In additional embodiments, the adhesive 48 can be deposited on the second side 44 of the window 40 instead of, or in addition to, the first side 26 of the image sensor die 20. The microelectronic device 10 can also include a removable protective covering 49 attached to the first side 42 of the window 40 to protect the window 40 from scratches and other defects during the manufacturing process.

Figure 2:
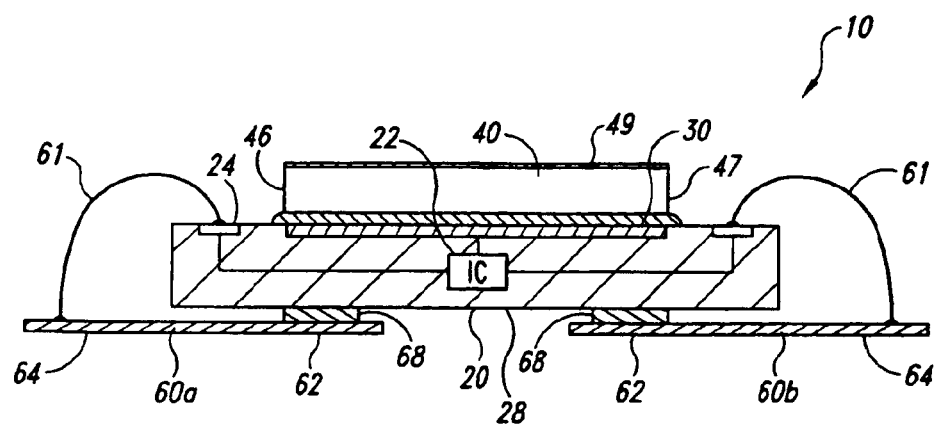

FIG. 2 is a schematic cross-sectional side view of the microelectronic device 10 after attaching a plurality of leads 60 (identified individually as 60a–b) to the image sensor die 20. In the illustrated embodiment, the leads 60 are generally straight members that include a first portion 62 and a second portion 64 spaced apart from the first portion 62. The first portion 62 is attached to the second side 28 of the image sensor die 20 with an adhesive 68, such as a lead-on-chip tape or another suitable material. The first portion 62 can be attached to the image sensor die 20 between the first end 46 and the second end 47 of the window 40. A plurality of wire bonds 61 electrically couple the second portion 64 of the leads 60 to corresponding bond-pads 24 on the image sensor die 20. In other embodiments, such as those described below with reference to FIGS. 5–8, the leads can have other configurations.

Figure 3:
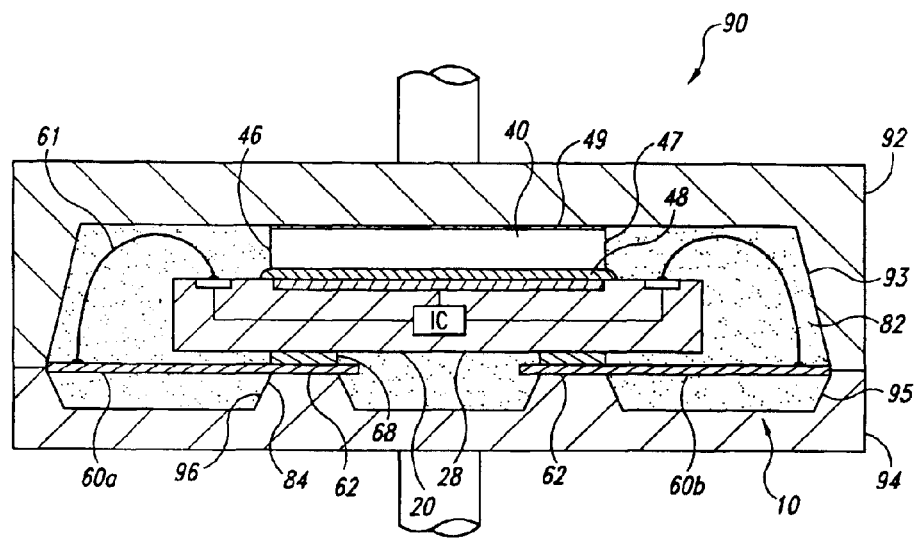

FIG. 3 is a schematic cross-sectional side view of a mold apparatus 90 for encapsulating the microelectronic device 10 of FIG. 2 in accordance with one embodiment of the invention. In one aspect of this embodiment, the mold apparatus 90 includes an upper mold portion 92 having an upper mold cavity 93 and a lower mold portion 94 having a lower mold cavity 95. The upper mold cavity 93 is configured to receive the image sensor die 20, the window 40, and the wire bonds 61. The lower mold cavity 95 is configured to receive the leads 60. The lower mold portion 94 can also include projections 96 positioned to press the microelectronic device 10 against the upper mold portion 92 to prevent a mold compound 82 from bleeding between the protective covering 49 and the upper mold portion 92. More specifically, the projections 96 are arranged to exert a force against the first portion 62 of the leads 60 in a direction generally normal to the microelectronic device 10. The force is exerted between the first end 46 and the second end 47 of the window 40 so that the force is transferred through the leads 60, the adhesive 68, the image sensor die 20, the adhesive 48, and the window 40 to (a) secure the semiassembled chip so that during molding the high pressure mold compound is eliminated or greatly reduced, and (b) increase the stability of the microelectronic device 10 within the mold apparatus 90. Accordingly, the mold compound 82 is introduced into the mold apparatus 90 and flows around the microelectronic device 10 to form a casing 80, which encapsulates the image sensor die 20 and a portion of the leads 60. In this embodiment, the projections 96 create a plurality of recesses 84 in the casing 80 over the first portion 62 of the leads 60. In other embodiments, the mold apparatus 90 may not include the projections 96. The microelectronic device 10 can be heated before and/or after encapsulation to cure the adhesive 48 and/or the mold compound 82.

Figure 4:
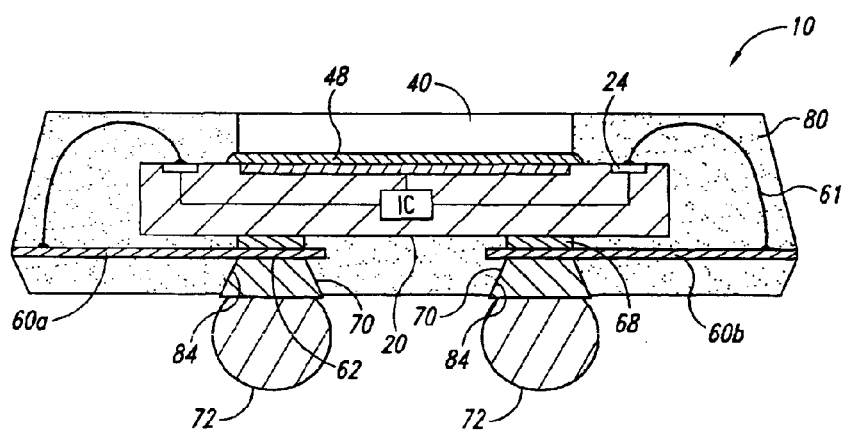

FIG. 4 is a schematic cross-sectional side view of the microelectronic device 10 after forming a plurality of solder balls. After removing the microelectronic device 10 from the mold apparatus 90 (FIG. 3), a plurality of ball-pads 70 are formed in corresponding recesses 84 in the casing 80. The ball-pads 70 can be formed on and electrically coupled to the first portion 62 of the leads 60. Next, a plurality of solder balls 72 are formed on corresponding ball-pads 70 and accordingly electrically coupled to corresponding bond-pads 24 on the image sensor die 20. In other embodiments, the microelectronic device 10 may not include ball-pads 70. For example, the solder balls 72 can be formed directly on the first portion 62 of the leads 60. In any of these embodiments, the solder balls 72 can be arranged in arrays for attachment to circuit boards or other devices. The protective covering 49 (FIG. 3) can be removed from the window 40 at the end of the packaging process.

One feature of the microelectronic device of the illustrated embodiment is the leads are positioned proximate to the image sensor die and the center of the device. An advantage of this feature is that the microelectronic device efficiently transfers heat away from the image sensor die and center of the device. Another feature of the microelectronic device is the placement of the mold compound against the second side of the image sensor die. An advantage of this feature is the improved reliability of the microelectronic device because the mold compound adheres to the image sensor die.

C. Other Packaged Microelectronic Devices

Figure 5:
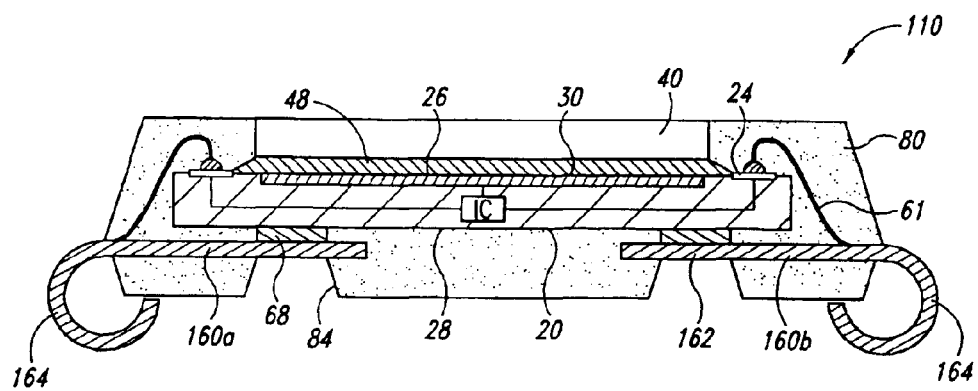
FIG. 5 is a schematic cross-sectional side view of a microelectronic device in accordance with another embodiment of the invention.

FIG. 5 is a schematic cross-sectional side view of a microelectronic device 110 in accordance with another embodiment of the invention. The microelectronic device 110 can be similar to the microelectronic device 10 described above with reference to FIG. 4. For example, the microelectronic device 110 includes an image sensor die 20, a window 40 attached to the image sensor die 20, and a casing 80 covering a portion of the image sensor die 20. The microelectronic device 110 further includes a plurality of leads 160 (identified individually as 160*a–b*) coupled to the second side 28 of the image sensor die 20 and electrically coupled to corresponding bond-pads 24. The leads 160 include a first portion 162 coupled to the image sensor die 20 and a second portion 164 external to the casing 80. The second portion 164 has a generally arcuate configuration for attachment to an external device. More specifically, the second portion 164 projects outward away from the casing 80, curves downward, and then curves inward like a "C." An advantage of the curvature of the second portion 164 is the improved robustness of the leads 160 because they do not have sharp angles. Accordingly, the leads 160 are less likely to bend or break if the microelectronic device 110 is dropped. In other embodiments, the casing 80 may not include recesses 84.

Figure 6:
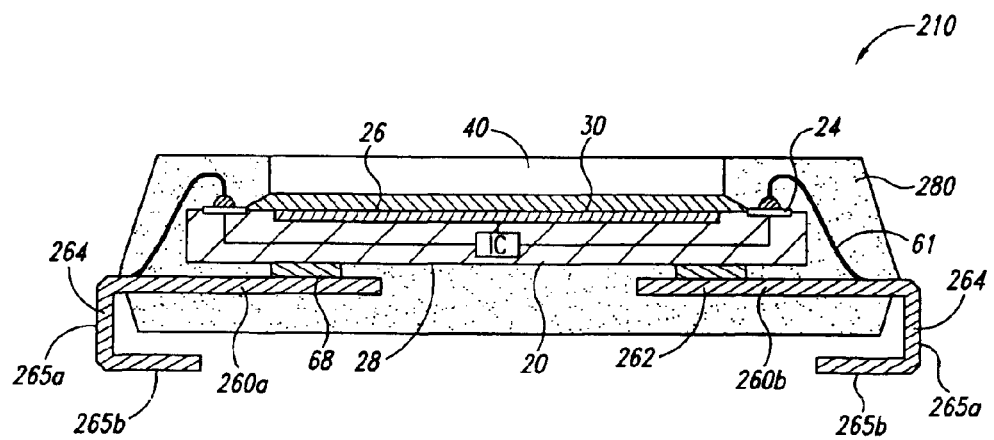
FIG. 6 is a schematic cross-sectional side view of a microelectronic device in accordance with still another embodiment of the invention.

FIG. 6 is a schematic cross-sectional side view of a microelectronic device 210 in accordance with another embodiment of the invention. The microelectronic device 210 can be similar to the microelectronic device 10 described above with reference to FIG. 4. For example, the microelectronic device 210 includes an image sensor die 20, a window 40 attached to the image sensor die 20, and a casing 280 enclosing a portion of the image sensor die 20. The microelectronic device 210 further includes a plurality of leads 260 (identified individually as 260*a–b*) coupled to the second side 28 of the image sensor die 20 and electrically coupled to corresponding bond-pads 24. The leads 260 include a first portion 262 attached to the second side 28 of the image sensor die 20 and a second portion 264 external to the casing 280. The second portion 264 has an "L" shaped configuration with a first segment 265*a* extending downward and a second segment 265*b* projecting inward in a direction generally parallel to the image sensor die 20. An advantage of the "L" shaped configuration of the leads 260 is that it reduces the profile of the device 210 because the first segment 265*a* of the second portion 264 projects downwardly as opposed to away from the device 210. In additional embodiments, the leads 260 can have other configurations for attachment to external devices.

FIG. 7 is a schematic cross-sectional side view of a microelectronic device 310 in accordance with another embodiment of the invention. The microelectronic device 310 can be similar to the microelectronic device 10 discussed above with reference to FIG. 4. For example, the microelectronic device 310 includes an image sensor die 20, a window 40 attached to the image sensor die 20, and a casing 380 covering a portion of the image sensor die 20. The microelectronic device 310 further includes a plurality of leads 360 (identified individually as 360*a–b*) coupled to the second side 28 of the image sensor die 20 and electrically coupled to corresponding bond-pads 24. The leads 360 include a first portion 362 coupled to the image sensor die 20 and a second portion 364 projecting away from the image sensor die 20. In the illustrated embodiment, the second portion 364 includes a first segment 365*a* generally coplanar with the first portion 362 and a second segment 365*b* coupled to the first segment 365*a*. The first and second segments 365*a–b* are oriented transversely relative to each other. The casing 380 includes a plurality of recesses 386 over the first and second segments 365*a–b* to expose the segments 365*a–b* to the ambient environment for attachment to an external device. The recesses 386 can be formed by removing portions of the casing 380, or a mold cavity can form the casing 380 in such a way as to expose the first and second segments 365*a–b*.

One feature of the microelectronic device 310 of the illustrated embodiment is that the leads 360 do not project from the casing 380. An advantage of this arrangement is that the microelectronic device 310 has a lower profile and is more robust because the leads 360 are less likely to break or bend.

FIG. 8 is a schematic cross-sectional side view of a microelectronic device 410 in accordance with another embodiment of the invention. The microelectronic device 410 can be similar to the microelectronic device 10 discussed above with reference to FIG. 4. For example, the microelectronic device 410 includes an image sensor die 20, a window 40 attached to the image sensor die 20, and a casing 480 covering a portion of the image sensor die 20. The microelectronic device 410 further includes a plurality of leads 460 (identified individually as 460*a–b*) coupled to the second side 28 of the image sensor die 20 and electrically coupled to corresponding bond-pads 24. The leads 460 include a first portion 462 coupled to the image sensor die 20, a second portion 464 projecting away from the image sensor die 20, and a first bend 466a between the first portion 462 and the second portion 464. The second portion 464 includes a first segment 465a and a second segment 465b coupled to the first segment 465a at a second bend 466b. The first segment 465a is generally parallel to the first portion 462 and projects at least partially beyond a bottom surface 481 of the casing 480. Accordingly, the first segment 465a is exposed to the ambient environment for attachment to an external device. The second segment 465b is transverse to the first segment 465a and can also be exposed to the ambient environment.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A packaged microelectronic device, comprising:
   an image sensor die having a first side with a bond-pad, an active area on the first side, and a second side opposite the first side;
   a radiation transmissive window attached to the first side of the die and positioned over the active area; and
   a lead mounted to the second side of the image sensor die and electrically coupled to the bond-pad.

2. The device of claim 1, further comprising a casing over the bond-pad, at least a portion of the second side of the image sensor die, and at least a portion of the lead.

3. The device of claim 1, further comprising a casing over the bond-pad, at least a portion of the second side of the image sensor die, and a portion of the lead; and
   wherein the lead includes an end external to the casing.

4. The device of claim 1 wherein the lead is coupled to the second side of the image sensor die by a lead-on-chip tape.

5. The device of claim 1 wherein the window is attached to the image sensor die with an adhesive.

6. A packaged microelectronic device, comprising:
   an image sensor die having a first side with a bond-pad, an active area on the first side, and a second side opposite the first side;
   a radiation transmissive window positioned over the active area;
   a lead mounted to the second side of the image sensor die and electrically coupled to the bond-pad;
   a casing over the bond pad at least a portion of the second side of the image sensor die, and at a portion of the lead; and
   a solder ball electrically coupled to the lead.

7. A packaged microelectronic device, comprising:
   an image sensor die having a first side with a bond-pad, an active area on the first side, and a second side opposite the first side;
   a radiation transmissive window positioned over the active area;
   a lead mounted to the second side of the image sensor die and electrically coupled to the bond-pad; and
   a casing over at least a portion of the second side of the image sensor die;
   wherein the lead includes a first end and a second end opposite the first end;
   wherein the first and second end are covered by the casing; and
   wherein a portion of the lead between the first and second ends is exposed to an ambient environment.

8. A packaged microelectronic device, comprising:
   an image sensor die having a first side with a bond-pad, an active area on the first side, and a second side opposite the first side;
   a radiation transmissive window positioned over the active area;
   a lead mounted to the second side of the image sensor die and electrically coupled to the bond-pad; and
   a casing over at least a portion of the second side of the image sensor die;
   wherein the lead includes a first portion attached to the second side of the image sensor die and a second portion at least proximate to the first portion;
   wherein the casing has a recess exposing the second portion of the lead to an ambient environment; and
   wherein the recess defines axis that intersects the window and the image sensor die.

9. A packaged microelectronic device, comprising:
   an image sensor die having a first side with a bond-pad, an active area on the first side, and a second side opposite the first side;
   a radiation transmissive window positioned over the active area;
   a lead mounted to the second side of the image sensor die and electrically coupled to the bond-pad; and
   a casing over at least a portion of the second side of the image sensor die and a second portion spaced apart from the first portion; and
   wherein the lead includes a first portion attached to the image sensor die and a second portion spaced apart from the first portion; and
   wherein the casing includes a recess exposing the second portion of the lead for attachment to a substrate.

10. A packaged microelectronic device, comprising:
    an image sensor die having a first side with a bond-pad, an active area on the first side, and a second side opposite the first side;
    a radiation transmissive window positioned over the active area; and
    a lead mounted to the second side of the image sensor die and electrically coupled to the bond-pad;
    wherein the window includes a first side and a second side attached to the image sensor die and opposite the first side; and
    wherein the device further comprises a removable protective covering over at least a portion of the first side of the window.

11. A packaged microelectronic device, comprising:
    an image sensor die having a first side with an active area, a plurality of bond-pads on the first side, and a second side opposite the first side;
    a radiation transmissive member juxtaposed to the first side of the image sensor die;
    a plurality of leads carried by the second side of the image sensor die and electrically coupled to corresponding bond-pads; and
    a casing covering the bond-pads, at least a portion of the second side of the image sensor die, and at least a portion of the individual leads.

12. The device of claim 11 wherein the leads include an end external to the casing.

13. The device of claim 11, further comprising:
a plurality of ball-pads on corresponding leads; and
a plurality of solder balls on corresponding ball-pads;
wherein the leads are not exposed to an ambient environment.

14. The device of claim 11 wherein:
the leads include a first end and a second end opposite the first end;
the first and second ends are covered by the casing; and
a portion of the leads between the first and second ends are exposed to an ambient environment.

15. The device of claim 11 wherein the leads are attached to the second side of the image sensor die by a lead-on-chip tape.

16. The device of claim 11 wherein:
the leads include a first portion attached to the second side of the image sensor die and a second portion at least proximate to the first portion;
the casing has a plurality of recesses exposing the second portion of the leads; and
the recesses define a plurality of axes that intersect the window and the image sensor die.

17. The device of claim 11 wherein:
the leads include a first portion attached to the image sensor die and a second portion spaced apart from the first portion; and
the casing includes a plurality of recesses exposing the second portion of the leads for attachment to a substrate.

18. The device of claim 11 wherein:
the window includes a first side and a second side opposite the first side, the second side being attached to the image sensor die; and
the device further comprises a removable protective covering over at least a portion of the first side of the window.

19. The device of claim 11 wherein the leads include a portion external to the casing, the portion having an arcuate configuration.

20. The device of claim 11 wherein the leads include a portion external to the casing, the portion having an "L" shaped configuration.

21. The device of claim 11 wherein the radiation transmissive member comprises a window.

22. A packaged microelectronic device, comprising:
an image sensor die having a first side with a bond-pad, an active area, and a second side opposite the first side;
a window at the first side of the image sensor die;
a lead mounted to the second side of the image sensor die and electrically coupled to the bond-pad, the lead having a first end and a second end opposite the first end; and
a casing over the bond-pad and at least a portion of the second side of the image sensor die, wherein at least a portion of the second end of the lead is exposed through the casing.

23. The device of claim 22 wherein:
the lead further includes a first portion attached to the second side of the image sensor die and a second portion at least proximate to the first portion;
the casing has a recess exposing the second portion of the lead; and
the recess defines an axis that intersects the window and the image sensor die.

24. The device of claim 22 wherein the lead is attached to the second side of the image sensor die by a lead-on-chip tape.

25. The device of claim 22 wherein:
the window includes a first side and a second side opposite the first side, the second side being attached to the image sensor die; and
the device further comprises a removable protective covering over at least a portion of the first side of the window.

26. The device of claim 22 wherein the second end of the lead has an arcuate configuration.

27. The device of claim 22 wherein the second end of the lead has an "L" shaped configuration.

28. A method for packaging a microelectronic device including an image sensor die having a first side with a bond-pad, an active area, and a second side opposite the first side, the method comprising:
attaching a radiation transmissive window to the first side of the image sensor die;
mounting a lead to the second side of the image sensor die;
electrically coupling the bond-pad to the lead; and
encapsulating at least a portion of the lead and at least a portion of the second side of the image sensor die with a casing.

29. The method of claim 28, further comprising attaching a removable protective covering over at least a portion of the window.

30. The method of claim 28 wherein the lead includes an end, and
wherein encapsulating at least a portion of the lead comprises covering the portion of the lead with the casing without covering the end of the lead.

31. The method of claim 29, further comprising:
forming a ball-pad on the lead; and
placing a solder ball on the ball-pad.

32. The method of claim 28 wherein the lead includes a first end and a second end opposite the first end, and wherein encapsulating at least a portion of the lead comprises covering the first and second ends of the lead with the casing without covering a portion of the lead between the first and second ends.

33. The method of claim 28 wherein:
the lead includes a first portion and a second portion at least proximate to the first portion, the first portion being attached to the second side of the image sensor die; and
encapsulating at least a portion of the lead comprises covering the portion of the lead with the casing without covering the second portion of the lead.

34. The method of claim 28 wherein coupling the lead to the image sensor die comprises attaching the lead to the image sensor die with a lead-on-chip tape.

35. A method for packaging a microelectronic device, comprising:
positioning a window at an active area of a first side of an image sensor die;
mounting a lead to a second side of the image sensor die opposite the first side;

electrically coupling a bond-pad on the first side of the image sensor die to the lead;

disposing the window, the image sensor die, and the lead in a mold cavity; and injecting a mold compound into the mold cavity to encapsulate at least a portion of the image sensor die.

36. The method of claim 35 wherein disposing the window, the image sensor die, and the lead in the mold cavity comprises applying a force to the lead to press the window against a wall of the mold cavity.

37. The method of claim 35, further comprising:

removing the window, the image sensor, and the lead from the mold cavity as a unit;

forming a ball-pad on the lead; and placing a solder ball on the ball-pad.

38. The method of claim 35, further comprising attaching a removable protective covering over the window before disposing the window in the mold cavity.

* * * * *

UNITED STATES PATENT AND TRADEMARK OFFICE
CERTIFICATE OF CORRECTION

PATENT NO. : 6,882,021 B2  
DATED : April 19, 2005  
INVENTOR(S) : Suan Jeung Boon et al.

It is certified that error appears in the above-identified patent and that said Letters Patent is hereby corrected as shown below:

Column 7,
Line 66, "end" should be -- ends --;

Column 8,
Line 19, insert -- an -- between "defines" and "axis".

Signed and Sealed this

Fifteenth Day of November, 2005

JON W. DUDAS
*Director of the United States Patent and Trademark Office*